(12) United States Patent
Kashiwakura

(10) Patent No.: US 9,980,370 B2
(45) Date of Patent: May 22, 2018

(54) PRINTED CIRCUIT BOARD HAVING A CIRCULAR SIGNAL PAD SURROUNDED BY A GROUND PAD AND AT LEAST ONE RECESS SECTION DISPOSED THEREBETWEEN

(71) Applicant: NEC Corporation, Tokyo (JP)

(72) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 63 days.

(21) Appl. No.: 14/912,677

(22) PCT Filed: Sep. 11, 2014

(86) PCT No.: PCT/JP2014/004679
§ 371 (c)(1),
(2) Date: Feb. 18, 2016

(87) PCT Pub. No.: WO2015/045309
PCT Pub. Date: Apr. 2, 2015

(65) Prior Publication Data
US 2016/0205768 A1    Jul. 14, 2016

(30) Foreign Application Priority Data

Sep. 24, 2013 (JP) ................... 2013-197419

(51) Int. Cl.
*H05K 1/02* (2006.01)
*H05K 1/11* (2006.01)
(Continued)

(52) U.S. Cl.
CPC .......... *H05K 1/0222* (2013.01); *H01P 1/045* (2013.01); *H01P 5/085* (2013.01); *H05K 1/0213* (2013.01);
(Continued)

(58) Field of Classification Search
CPC .......... H01P 5/085; H01P 1/045; H01P 1/047; H05K 1/0222
(Continued)

(56) References Cited

U.S. PATENT DOCUMENTS 2,983,884 A  *  5/1961  Rueger .................. H01P 3/081
                                                            333/238
3,757,272 A  *  9/1973  Laramee et al. ........ H01P 5/085
                                                            333/238
(Continued)

FOREIGN PATENT DOCUMENTS

CN    101292393    10/2008
CN    102365794     2/2012
(Continued)

OTHER PUBLICATIONS

Japanese Official Action—2015-538876—dated Oct. 11, 2016.
(Continued)

*Primary Examiner* — Benny Lee
(74) *Attorney, Agent, or Firm* — Young & Thompson

(57) ABSTRACT

To provide a printed board that solves the problem of transmission characteristics deterioration, the disclosed printed board includes a substrate, a circular signal pad that is provided on the substrate, a doughnut-shaped ground pad, which sandwiches the substrate that surrounds, in a doughnut shape, the signal pad, and which surrounds the outer circumference of the substrate, and one or more recessed sections that are disposed on the substrate that surrounds, in the doughnut shape, the signal pad.

20 Claims, 14 Drawing Sheets

(51) Int. Cl.
*H05K 3/00* (2006.01)
*H05K 3/40* (2006.01)
*H01P 1/04* (2006.01)
*H01P 5/08* (2006.01)

(52) U.S. Cl.
CPC .......... *H05K 1/0251* (2013.01); *H05K 1/113* (2013.01); *H05K 1/116* (2013.01); *H05K 3/0047* (2013.01); *H05K 3/40* (2013.01); *H05K 2201/09063* (2013.01); *H05K 2201/09609* (2013.01); *H05K 2201/09809* (2013.01)

(58) Field of Classification Search
USPC .................................................. 333/260, 246
See application file for complete search history.

(56) References Cited

U.S. PATENT DOCUMENTS

| | | | |
|---|---|---|---|
| 7,463,122 | B2 | 12/2008 | Kushta |
| 7,750,765 | B2 | 7/2010 | Kushta |
| 8,035,992 | B2 | 10/2011 | Kushta |
| 8,414,306 | B2 | 4/2013 | Tagawa et al. |
| 8,633,783 | B2 | 1/2014 | Shirakawa et al. |
| 2002/0101723 | A1 | 8/2002 | Bertin et al. |

FOREIGN PATENT DOCUMENTS

| | | |
|---|---|---|
| JP | 61-93003 | 6/1986 |
| JP | 64-44703 | 3/1989 |
| JP | 2007-158675 | 6/2007 |
| JP | 2011-101235 | 5/2011 |
| WO | 2004107830 A1 | 12/2004 |
| WO | 2007046271 A1 | 4/2007 |

OTHER PUBLICATIONS

Japanese Office Action dated Apr. 18, 2017; Application No. 2015-538876.
International Search Report, PCT/JP2014/004679, dated Dec. 16, 2014.
Chinese Office Action dated May 26, 2017; 201480052769.6.
Chinese Office Action dated Nov. 9, 2017; Application No. 201480052769.6.

\* cited by examiner

A-A'

(CROSS SECTION OF COAXIAL CONNECTOR 101)

B-B'

C-C'

PRINTED CIRCUIT BOARD HAVING A CIRCULAR SIGNAL PAD SURROUNDED BY A GROUND PAD AND AT LEAST ONE RECESS SECTION DISPOSED THEREBETWEEN

TECHNICAL FIELD

The invention relates to a printed board and a method for mounting on the printed board, in particular the printed board and the method for mounting on the printed board which reduce transmission characteristic deterioration.

BACKGROUND ART

In communication devices, impedance mismatching between a coaxial connector which a signal is inputted in and outputted from and a printed board does not matter in a transmission speed of around 10 to 25 Gbps. At a transmission speed of around 40 to 60 Gbps, however, even small floating capacitance at a pad portion between the coaxial connector and the printed board may be a factor which deteriorates transmission characteristics of devices.

As a technology to reduce harmonic noises in transmitted signals, Patent Literature 1 discloses a technology related to a multilayer printed board having a conductor via which is not connected to any one of a signal layer, a ground layer and the other layers and having desired frequency band rejection characteristics for inputted signals.

CITATION LIST

Patent Literature

[PTL 1]
Japanese Patent Application Laid-Open No. 2007-158675

SUMMARY OF THE INVENTION

Technical Problem

However, Patent Literature 1 does not describe solution for impedance reduction due to contact between a terminal of a coaxial connector and a pad of a printed board, for transmission characteristics deterioration.

An object of the invention is to provide a printed board which solves the above-mentioned technical problem of transmission characteristics deterioration.

Solution to the Problem

The printed board of the present invention includes a substrate, a circular signal pad that is provided on the substrate, a ground page that surrounds the periphery of the circular signal pad with a space, at least one recessed section disposed on the substrate between the circular signal pad and the ground pad.

Advantageous Effects of the Invention

According to the invention, impedance mismatching which is caused by floating capacitance at a contact portion between the coaxial connector and the printed board can be reduced and excellent transmission characteristics are obtained.

DETAILED DESCRIPTION OF THE EMBODIMENTS

By referring to drawings, preferable embodiments for carrying out the invention are described in detail. Although exemplary embodiments described below have limitations which are technically preferable to carry out the invention, the scope of the invention is not limited to following descriptions.

First Exemplary Embodiment

Figure 1:
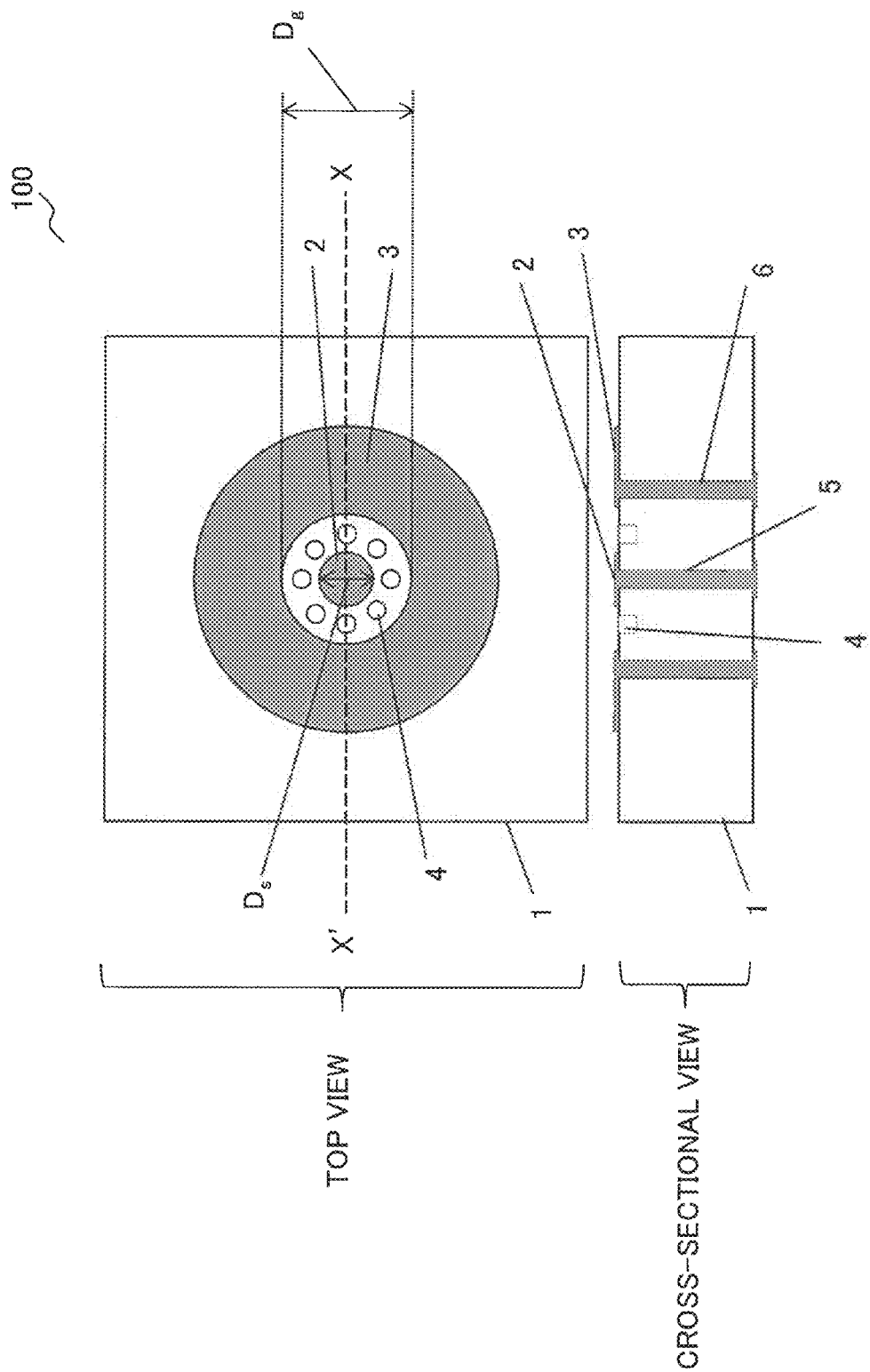
FIG. 1 illustrates a top view and a cross-sectional view of a printed board in a first exemplary embodiment of the invention.

An exemplary embodiment is explained by referring to drawings. FIG. 1 is a top view of a printed board of the exemplary embodiment and a cross-sectional view of the top view along the line X-X'. As shown in FIG. 1, a printed board 100 of the exemplary embodiment includes a substrate 1, a signal pad 2, a GND (ground) pad 3, a recessed section 4, a signal through-hole 5, and a GND ground through-hole 6.

As shown in the top view of FIG. 1, the substrate 1 includes, on a one face thereof (i.e., on the substrate 1), the circular signal pad 2, and a doughnut-shaped GND (ground) pad 3, surrounds the periphery of the circular signal pad 2 with a space and recessed section 4 being disposed on the substrate 1 between the circular signal pad 2 and GND (ground) pad 3 Since the signal pad 2 and the GND (ground) pad 3 have a circular shape, the shape of the substrate 1 which surrounds the signal pad 2 has a shape which is formed by a circle. Additionally, a plurality of circular recessed sections 4 are disposed on the substrate 1 between the signal pad 2 and the GND (ground) pad 3, in a nearly concentric manner with respect to the signal pad 2 and at nearly regular intervals.

The signal pad 2 is disposed on the substrate 1 as shown in the top view of FIG. 1. Further, as shown in the cross-sectional view of FIG. 1, the signal pad 2 is adjacent to an end portion of the signal through-hole 5, which is formed in the direction of thickness of the printed board 100, and is electrically connected to the end portion.

The GND (ground) pad 3, as shown in the top view of FIG. 1, is disposed on the substrate 1 to surround the signal pad 2 and the substrate 1 which surrounds the signal pad 2 and has a plurality of recessed sections which are formed in a nearly concentric manner with respect to the signal pad 2. Further, as shown in the cross-sectional view of FIG. 1, the GND (ground) pad 2 is adjacent to an end portion of the GND (ground) through-hole 6, which is formed in the direction of thickness of the printed board 100, and is electrically connected to the end portion.

As shown in the top view of FIG. 1, the recessed sections 4 are disposed on the substrate 1 in a nearly concentric manner with respect to the signal pad 2 to surround the signal pad 2. As shown in the cross-sectional view of FIG. 1, the recessed sections 4 are formed in the substrate 1 between the signal pad 2 and the GND (ground) pad 3 and between the signal through-hole 5 and GND (ground) through-hole 6, in the direction of thickness of the printed board 100 with a predetermined depth.

The signal through-hole 5 is disposed in the direction of thickness of the printed board 100. The signal through-hole 5 is adjacent to the signal pad 2, which is formed on one face of the printed board 100, and electrically connected thereto.

The GND (ground) through-hole 6 is disposed in the direction of thickness of the printed board 100. The GND (ground) through-hole 6 is adjacent to the GND (ground) pad 3 which is formed on one face of the printed board 100, and electrically connected thereto.

(Explanation of the Operation)

An operation of the printed board 100 in the exemplary embodiment is explained by exemplifying contact with a coaxial connector.

Figure 8:
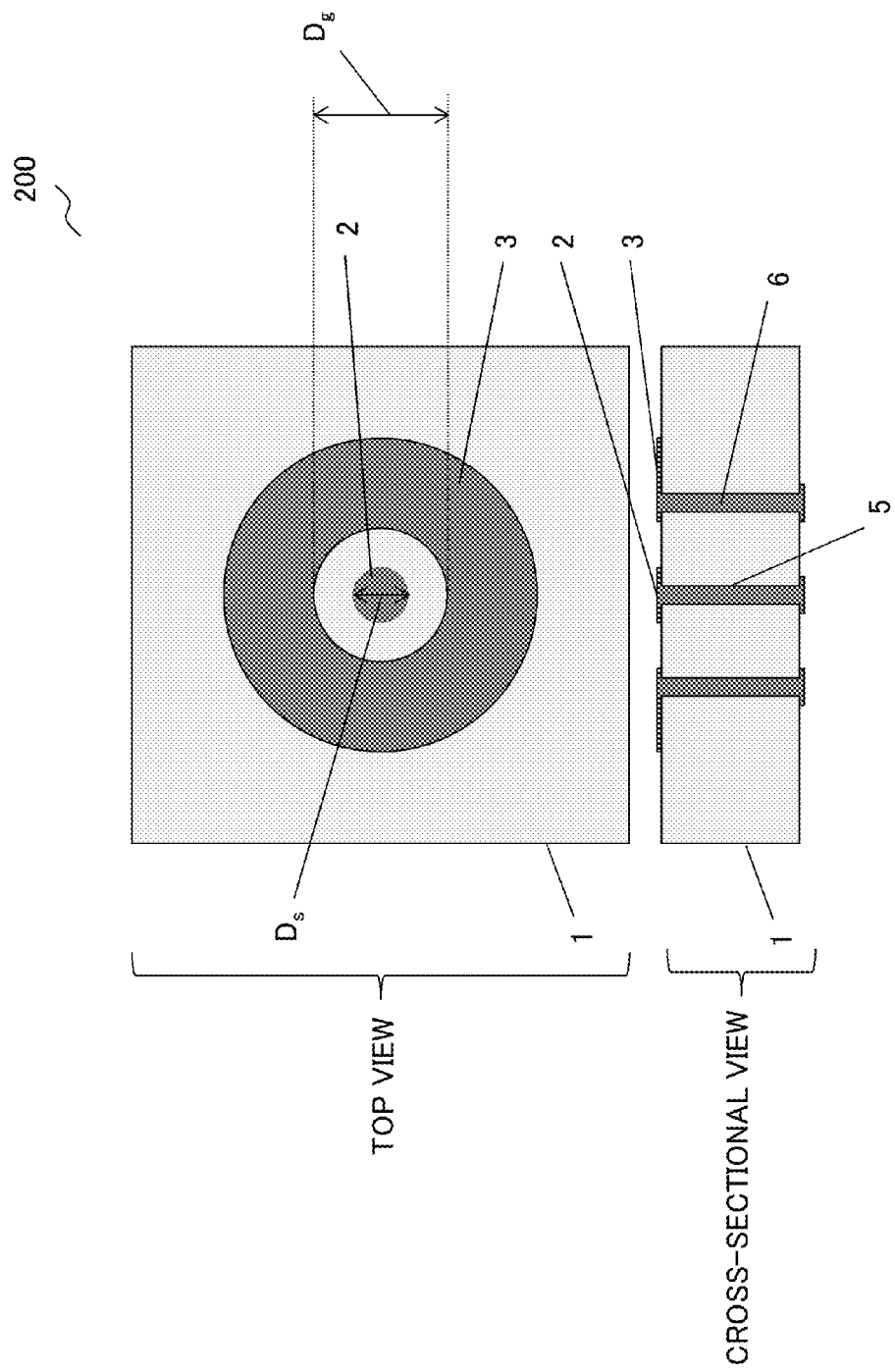
FIG. 8 illustrates a top view and a cross-sectional view of a printed board without the recessed section, as a comparative example.

FIG. 1 illustrating the printed board 100 of the exemplary embodiment is compared with a printed board 200 in FIG. 8 without the recessed sections 4 for explanation. FIG. 8 shows a top view and a cross-sectional view of a printed board 200 without the recessed section. The signal pad 2 is disposed on the substrate 1. Further, the signal pad 2 is adjacent to an end portion of the signal through-hole 5 which is formed in the direction of thickness of the printed board 200, and is electrically connected to the end portion. The GND (ground) through-hole 6 is disposed in the direction of thickness of the printed board 200. The GND (ground) through-hole 6 is adjacent to the GND (ground) pads 3, which are formed on one face of the printed board 200, and electrically connected thereto. The ground through-hole 6 surrounds the signal through-hole 5 in a donut shape. Ds is a diameter of the signal pad 2, and Dg is an inside diameter of the GND (ground) pad 3. In the top view of FIG. 1 and a top view of FIG. 8, characteristic impedance $Z_0[\Omega]$ of the contact portion of the printed substrate 100 is represented as the equation (1), $$Z_0[\Omega]=60/\{\epsilon_r \times \log_e(D_g/D_s)\} \quad (1),$$

where $D_s$ is a diameter of the signal pad 2, and $D_g$ is an inside diameter of the GND (ground) pad 3.

The above calculation is also applied to the printed board 200 without the recessed sections 4 in FIG. 8. In the equation, $\epsilon_r$ is a relative permittivity of the substrate 1. Since characteristic impedance of a coaxial connector to be connected is generally 50Ω, $Z_0[\Omega]$ is designed to be 50Ω in order to match the value (in order to have impedance matching).

Figure 2:
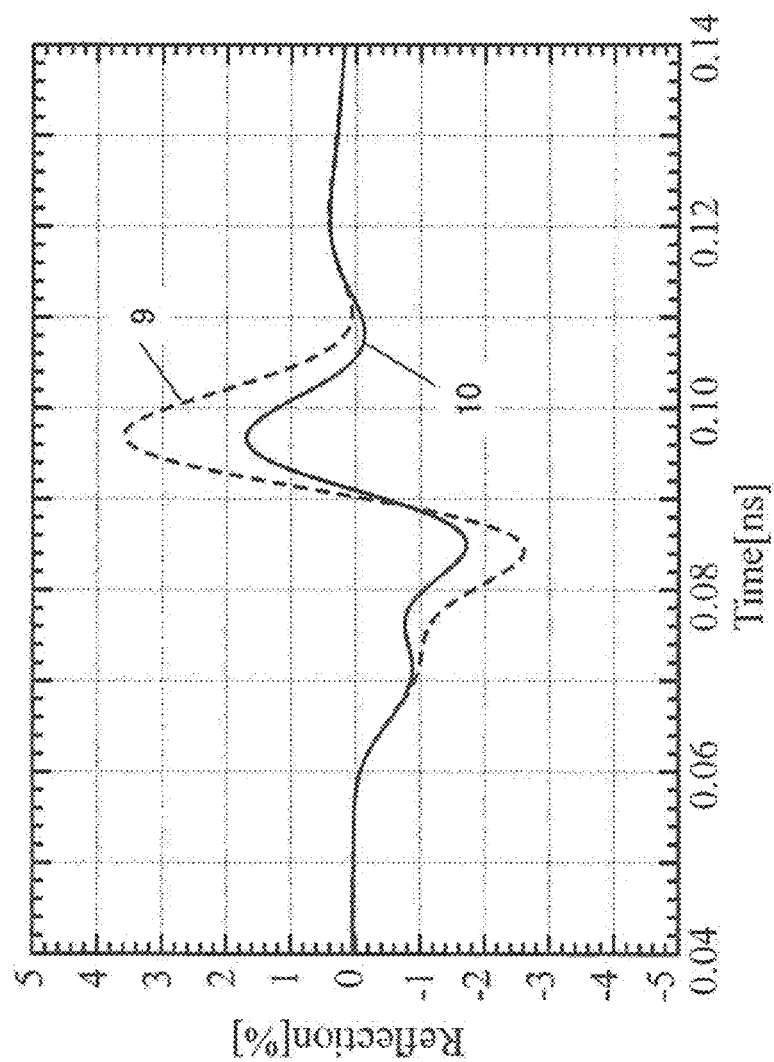
FIG. 2 is a drawing illustrating an amount of reflection in the printed board in the first exemplary embodiment of the invention and in the printed board without a recessed section.
Figure 3:
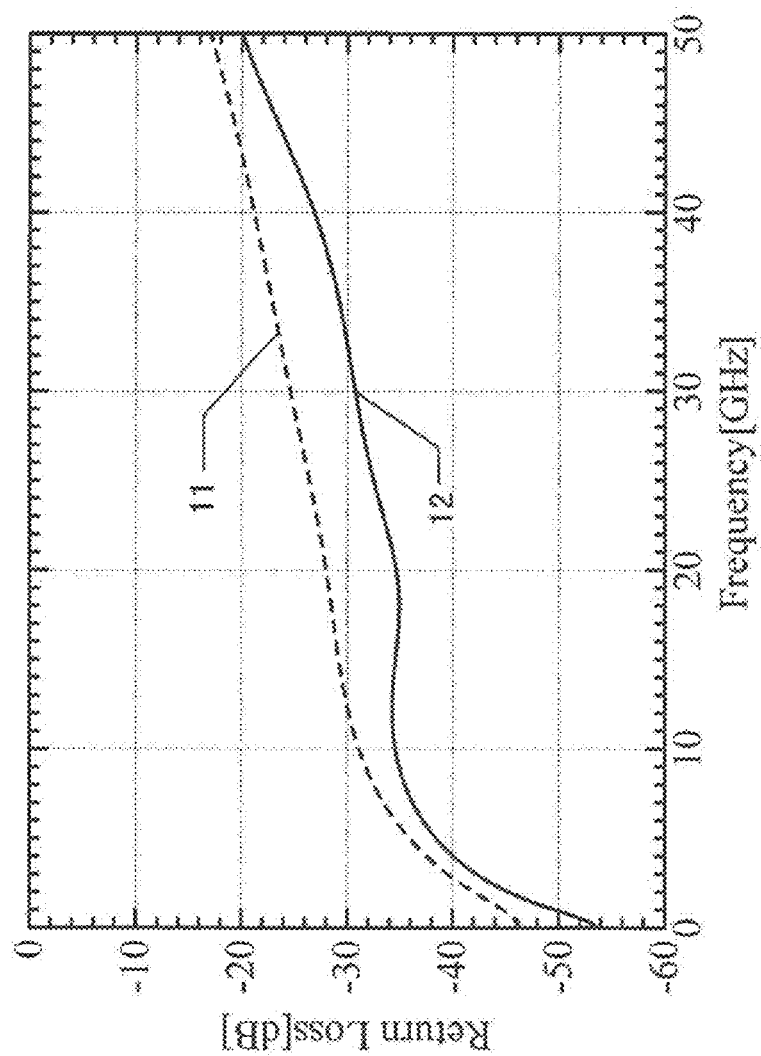
FIG. 3 is a drawing illustrating return loss characteristics in the printed board in the first exemplary embodiment of the invention and in the printed board without the recessed section.
Figure 4:
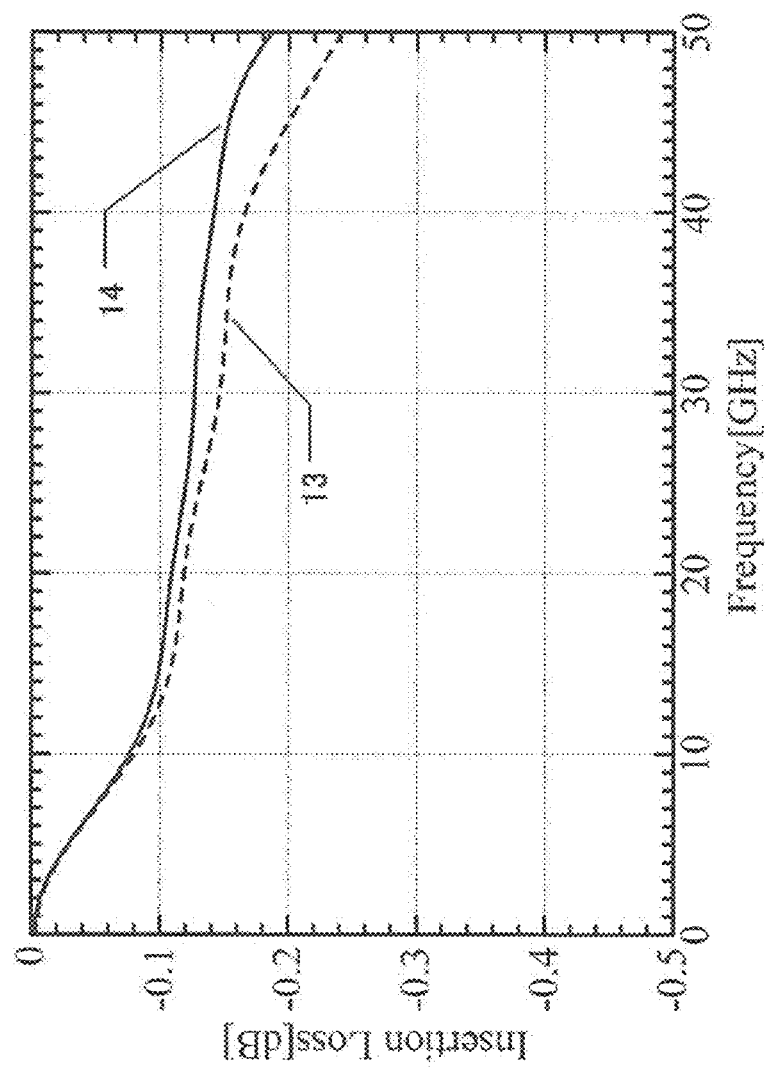
FIG. 4 is a drawing illustrating insertion loss characteristics in the printed board in the first exemplary embodiment of the invention and in the printed board without the recessed section.

However, since floating capacitance occurs when the coaxial connector comes in contact with the signal pad 2 and $\epsilon_r$ is increased, $Z_0[\Omega]$ is decreased from the value calculated by using the equation (1). Consequently, when the coaxial connector comes into contact with the printed board 100, the characteristic impedance $Z_0[\Omega]$ in the printed board side becomes smaller than 50Ω. FIG. 2 illustrates signal reflection characteristics which represent a case in which characteristic impedance of the coaxial connector do not coincide with that of the printed board 100 (impedance matching is not taken). FIG. 2 shows a case in which a Gaussian pulse, as a signal, is applied from the coaxial connector side, and an amount of reflection (%) with respect to time in ns elapsed after the above application is calculated. The calculated values represent values which are calculated based on measured values on a printed board having following size and materials as a reference. It is however considered that response to a signal frequency shows similar behavior regardless of the following size and materials. As sizes around a contact part to be come into contact with a coaxial connector in the printed board for measurement, $D_s$ is 0.6 mm to 0.7 mm, $D_g$ is 1 mm to 2 mm, the diameter of the recessed section 4 is 0.2 mm to 0.3 mm, the outer diameter of the GND (ground) pad is 5 mm, the inside diameters of the signal through-hole and the GND (ground) through-hole are 0.3 mm to 0.4 mm, the distance between the signal through-hole and the GND (ground) through-hole is around 1 mm to 2 mm. The material is glass-epoxy with $\epsilon_r$ of about 4. In FIG. 2, the dashed line represents an amount of reflection 9 without the recessed section 4, and the solid line represents an amount of the reflection 10 with the recessed section 4. As shown in FIG. 2, if the recessed sections 4 are disposed on the substrate 1 which surrounds the signal pad 2 in a doughnut shaped region, impedance matching between the coaxial connector and the printed board 100 is taken and the amount of reflection of a signal is decreased. FIG. 3 shows frequency in GHz dependence of return loss in dB which is calculated before and after the recessed section 4 is disposed on the substrate 1 which surrounds the signal pad 2 in a doughnut shaped region. FIG. 4 shows frequency in GHz dependence of insertion loss in dB.

In FIG. 3, the dashed line represents return loss 11 without recessed section 4 and the solid line represents return loss 12 with recessed section 4. In FIG. 4, the dashed line represents insertion loss 13 without recessed section 4 and the solid line represents insertion loss 14 with recessed section 4. FIG. 2, FIG. 3 and FIG. 4 show that the printed board 100 of the exemplary embodiment has low return loss and insertion loss and excellent transmission characteristics compared with the printed board without the recessed section 4.

The reason why the recessed section 4 gives such effects is described below. Relative permittivity of the substrate 1, which is made of insulating material, is around 3 to 5. If the recessed section 4 is formed on the substrate 1, the recessed portion of the recessed section 4 in the substrate 1 is replaced by air whose relative permittivity is 1. Relative permittivity of the region which contributes to characteristic impedance is therefore decreased (i.e., capacitive coupling is suppressed), and characteristic impedance of the signal pad 2 which is decreased because of floating capacitance is increased.

(Explanation of the Effect)

When the recessed section 4 is formed in the substrate 1 around the signal pad 2, impedance mismatching due to floating capacitance can be suppressed and excellent transmission characteristics can be obtained.

Example

Figure 5:
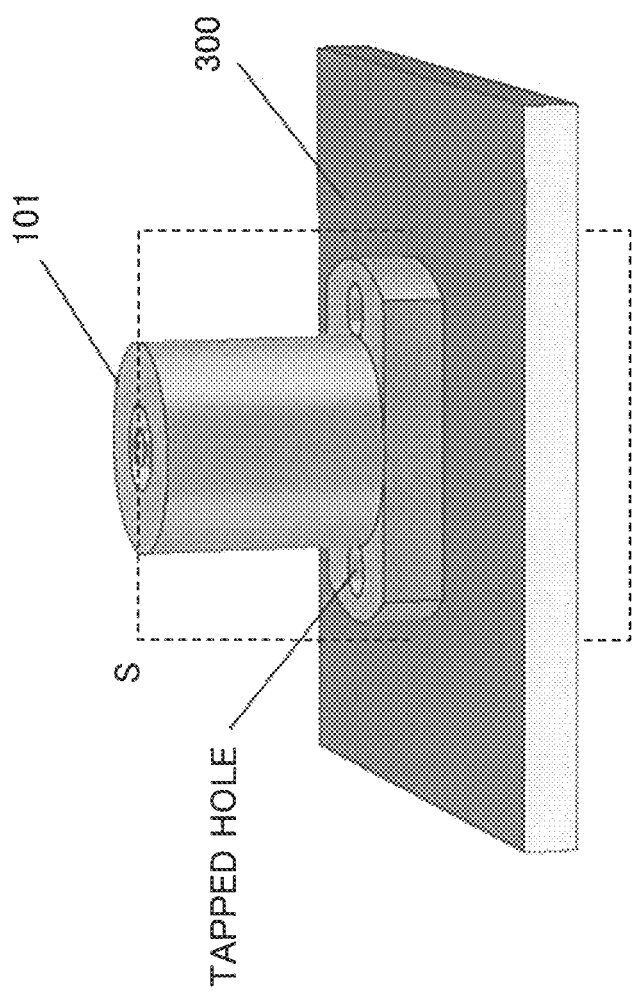
FIG. 5 is a drawing of an example in which a coaxial connector is connected to the printed board in the exemplary embodiment of the invention.

An example to which the invention in the first exemplary embodiment is applied is described. FIG. 5 illustrates images of a printed board 300 and a mounted coaxial connector 101 in the example. The coaxial connector 101 is connected to a coaxial cable, and connection between a device and a measuring instrument and between devices is performed. As the above coaxial connector 101, a coaxial connector which is connected to the printed board 300 by using a screw, etc. is available.

Figure 6:
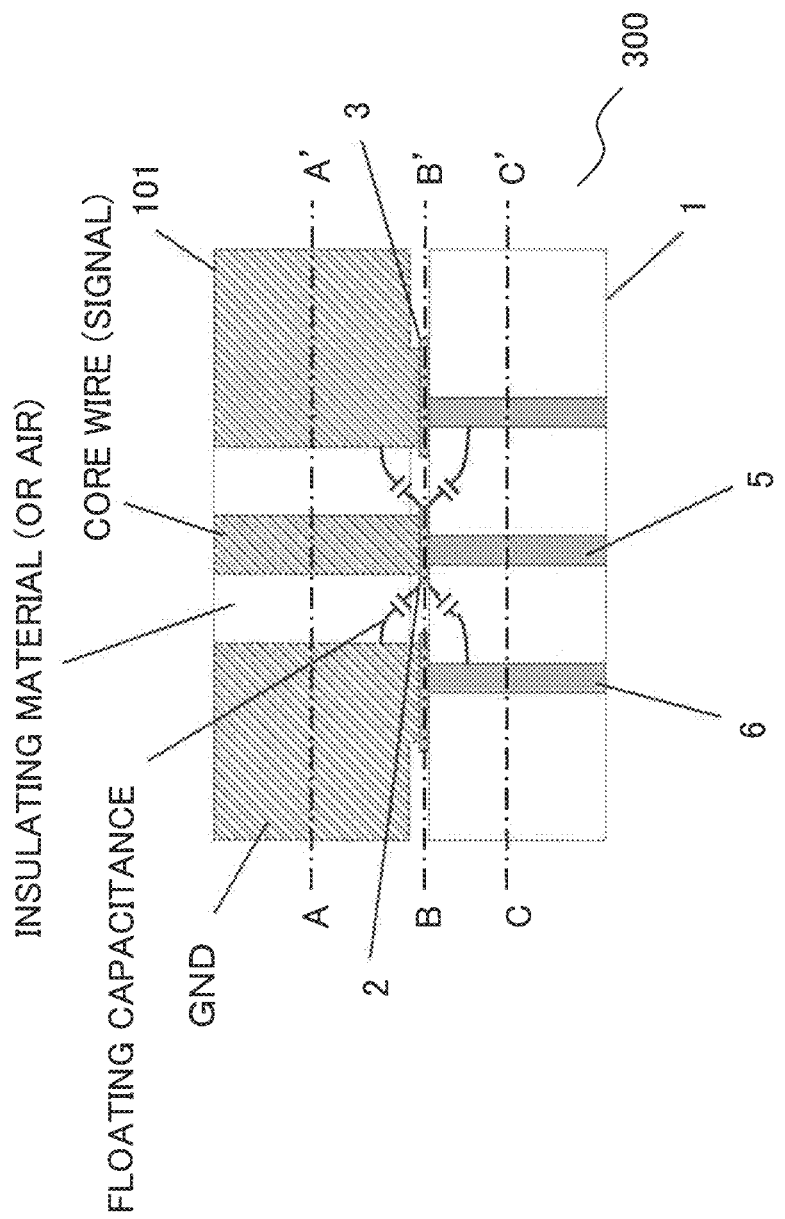
FIG. 6 is a cross-sectional view (portion) of an example in which the coaxial connector is connected to the printed board in the exemplary embodiment of the invention.
Figure 7A:
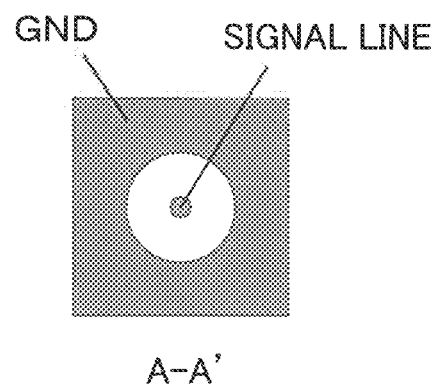
FIG. 7A illustrates a cross-sectional view along the line A-A' in FIG. 6.
Figure 7B:
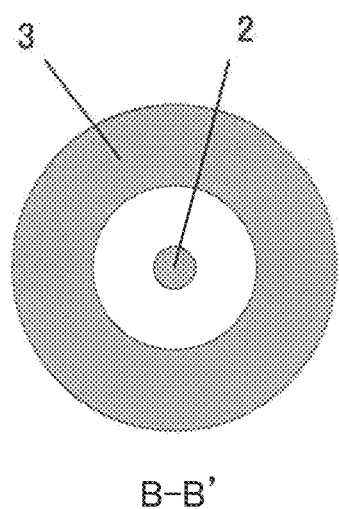
FIG. 7B illustrates a cross-sectional view along the line B-B' in FIG. 6.
Figure 7C:
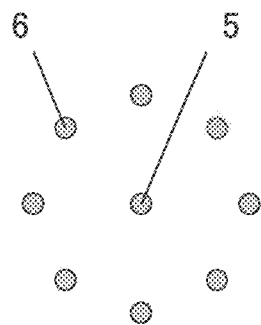
FIG. 7C illustrates a cross-sectional view along the line C-C' in FIG. 6.

FIG. 6 shows a cross-sectional structure along the plan face S in FIG. 5 (coaxial connector 101 is a part excluding a tapped hole part), and in particular an enlarged view of a contact part between the coaxial connector 101 and the printed board 300. Cross-sections along the lines A-A', B-B', and C-C' in FIG. 6 are illustrated in FIG. 7A, FIG. 7B, and FIG. 7C, respectively. The signal pad 2 is disposed on the substrate 1 as shown in FIG. 6. Further, the signal pad 2 is adjacent to an end portion of the signal through-hole 5 which is formed in the direction of thickness of the printed board 300, and is electrically connected to the end portion. The GND (ground) through-holes 6 are disposed in the direction of thickness of the printed board 300. The GND (ground) through-holes 6 are adjacent to the GND (ground) pads 3 which are formed on one face of the printed board 300, and electrically connected thereto. The ground through-holes 6 surround the signal through-hole 5 in a donut shape. The coaxial connector 101 has a signal or core wire at the center, its surrounding is an insulating material or air, and the outside is surrounded by a GND (ground). Floating capacitances are added as illustrated in FIG. 6. As shown in FIG. 7A, FIG. 7B, and FIG. 7C, each of cross-sections along the lines A-A' and B-B' illustrated in FIG. 6 has a coaxial cross-sectional structure. FIG. 7A shows a cross section of the coaxial connector 101 along the line A-A'. The signal line and GND in FIG. 7A are the same as the core wire and GND in FIG. 6, respectively. FIG. 7B shows a cross section of the signal pad 2 and the GND (ground) pad 3 along the line B-B'. FIG. 7C shows the signal through-hole 5 and the GND (ground) through-holes 6 along the line C-C'. FIG. 7C shows a case without the recessed section 4. In this case it is large like the amount of reflection 9 in FIG. 2. However, when there is the recessed section 4, it becomes smaller as shown by the amount of reflection 10 in FIG. 2.

Impedance matching between the coaxial connector 101 illustrated by the cross section along the line A-A' and the signal pad 2 and the GND (ground) pad 3 illustrated by the cross section along the line B-B' is easily made when characteristic impedance is designed. Usually the characteristic impedance is designed to be 50Ω. The cross section along the line C-C' illustrated in FIG. 6 has a pseudo-coaxial structure, and it is easy to design characteristic impedance of 50Ω.

Generally when lines with the same characteristic impedance are connected, impedance matching is taken and transmission characteristics do not receive a bad influence. If lines which differ from each other in shape, such as the connector 101 and the printed board 300, are connected to each other, impedance mismatching occurs. It can be considered that the boundary face has an uneven physical structure as shown in FIG. 6 and FIG. 7A, 7B, 7C, and floating capacitance is added as exemplified in FIG. 6.

Figure 9:
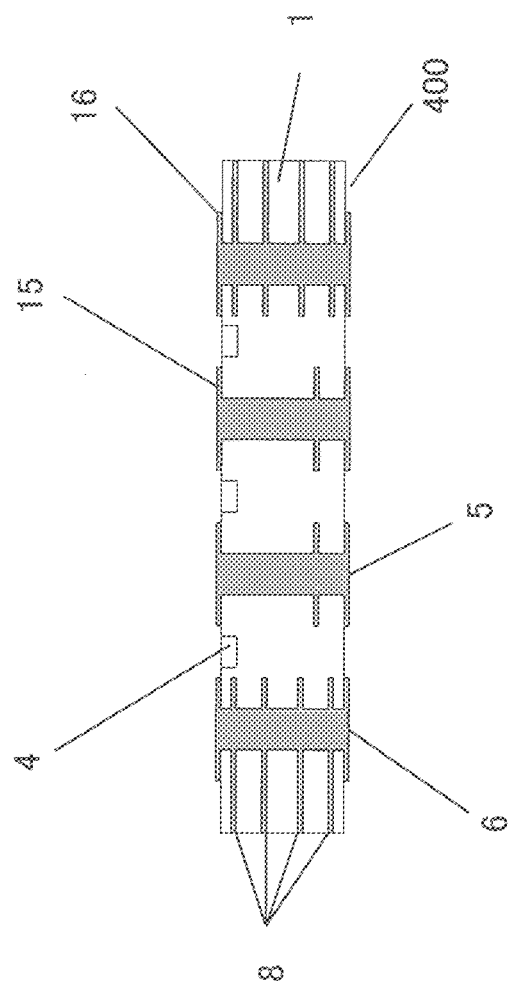
FIG. 9 illustrates a cross-sectional view (portion) of a printed board in a second exemplary embodiment of the invention.

FIG. 9 illustrates a cross-sectional view of a printed board 400 in a second exemplary embodiment of the invention. The exemplary embodiment differs from the first exemplary embodiment in that the recessed sections 4 are formed in the substrate 1 between a plurality of lands (signal lands 15 or GND (ground) lands 16) on the substrate 1. Signal through-holes 5 are disposed in the signal lands 15 inside the printed board 400. The GND (ground) through-hole 6 is physically and electrically connected to a GND (ground) layer 8.

Figure 10:
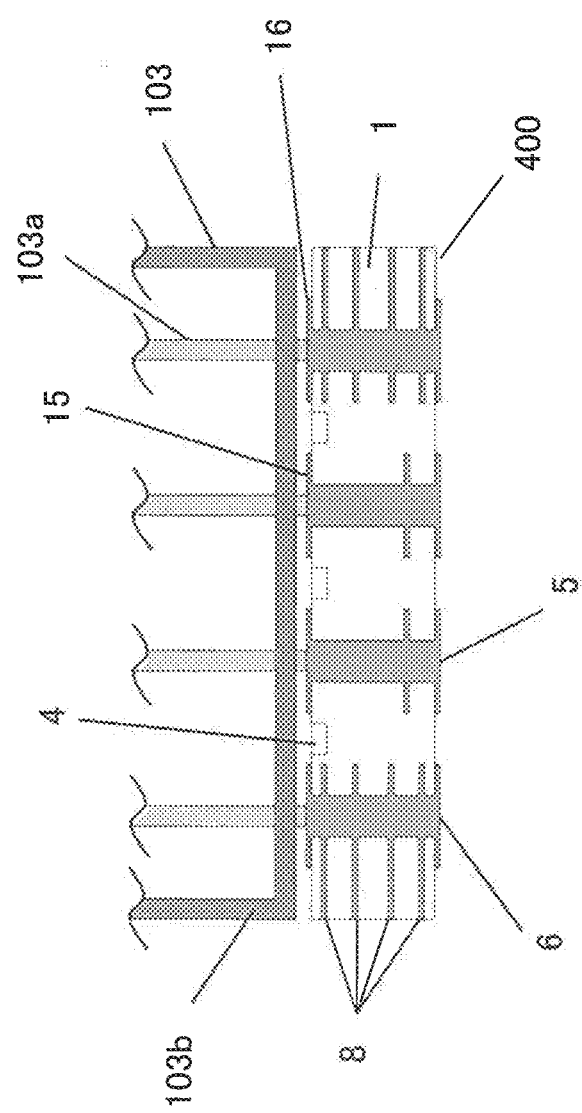
FIG. 10 illustrates a cross-sectional view (portion) illustrating a case in which a coaxial connector is connected to the printed board in the second exemplary embodiment of the invention.

FIG. 10 is a cross-sectional view illustrating a case in which a connector 103 having a plurality of connector terminals 103a is disposed on the printed board 400. The connector 103 includes the connectors 103a and a mold 103b. The structure of the printed board 400 is the same as that of the first exemplary embodiment except that the recessed sections 4 are disposed in the substrate 1 between the plurality of lands (signal lands 15 or GND (ground) lands 16). Signal through-holes 5 are disposed in the signal lands 15 inside the printed board 400. The recessed sections 4 can be disposed between two signal lands 15 or two GND (ground) lands 16, or between the signal land 15 and the GND (ground) land 16. The GND (ground) through-hole 6 is physically and electrically connected to a GND (ground) layer 8.

The structure provides the effect in which floating capacitance is decreased and excellent transmission characteristics are kept like the first exemplary embodiment with the coaxial connector 101 as shown in FIG. 5. As a more specific example, a connector connecting to a backplane or a sub board is available, as the connector 103.

The second exemplary embodiment exemplifies that the connector 103 with a plurality of connector terminals are disposed. However, when a plurality of connectors each having one connector terminal are disposed, the similar effect can be obtained if the recessed sections 4 are disposed on the substrate 1 between the plurality of lands.

Other Exemplary Embodiments

Figure 11:
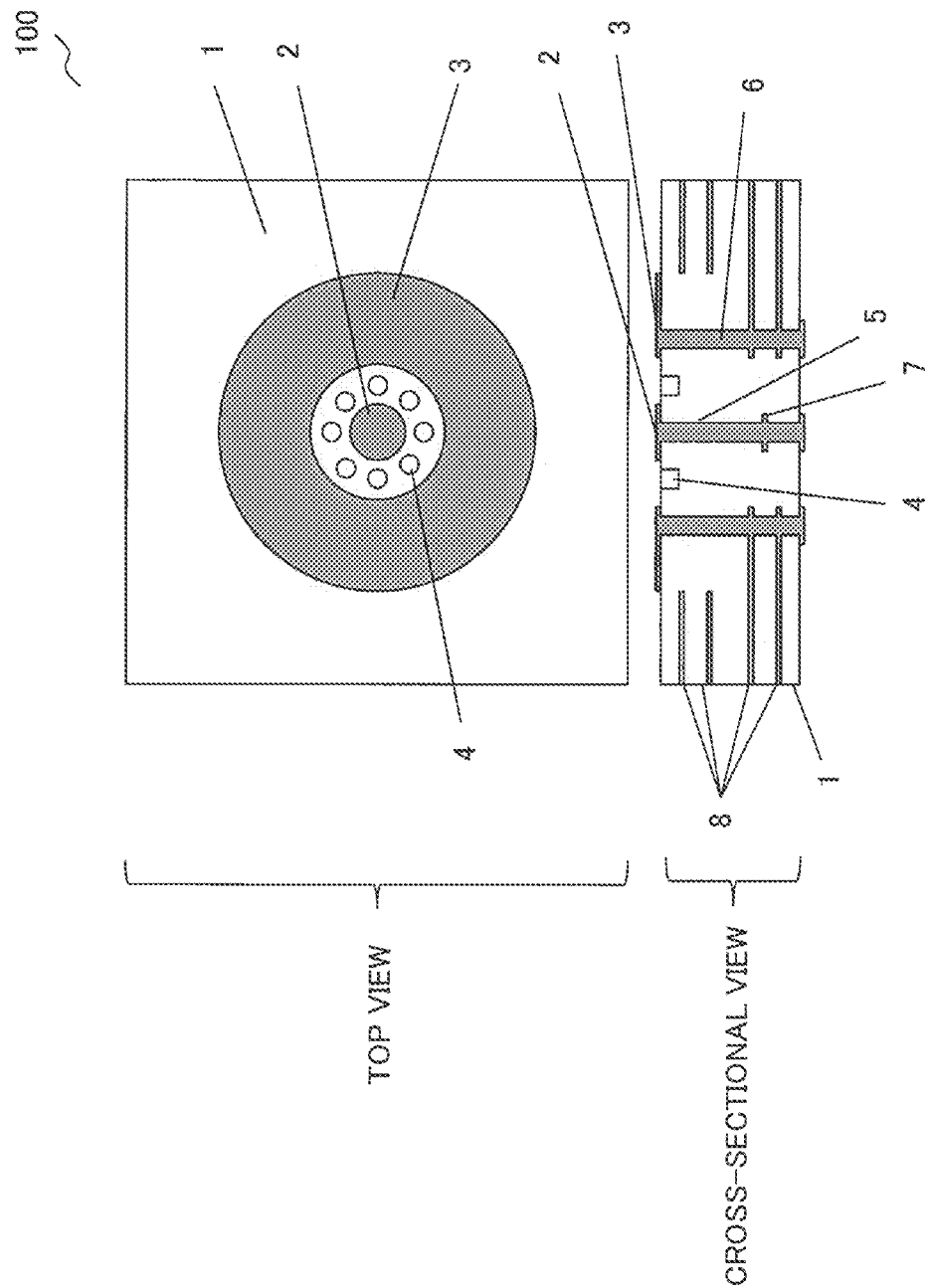
FIG. 11 illustrates a top view and a cross-sectional view of a printed board in other exemplary embodiments of the invention.

In the first exemplary embodiment as shown in FIG. 1, the printed board 100 includes the substrate 1, the signal pad 2, the GND (ground) pad 3, the recessed sections 4, the signal through-hole 5, and the GND (ground) through-hole 6. FIG. 11 illustrates a top view and a cross-sectional view of a printed board in other exemplary embodiments of the invention. As shown in the top view of FIG. 11, the substrate 1 includes, on one face thereof (i.e., on the substrate 1), the circular signal pad 2, and a doughnut-shaped GND (ground) pad 3, surrounds the periphery of the circular signal pad 2 with a space, and recessed sections 4 are disposed on the substrate 1 between the circular signal pad 2 and the GND (ground) pad 3. As shown in FIG. 11, the printed board 100 may optionally have various types of parts and materials like a GND (ground) layer 8. The signal pad 2 is disposed on the substrate 1 as shown in FIG. 11. Further, the signal pad 2 is adjacent to an end portion of the signal through-hole 5 which is formed in the direction of thickness of the printed board 100, and is electrically connected to the end portion. The GND (ground) through-holes 6 are disposed in the direction of thickness of the printed board 100. The GND (ground) through-holes 6 are adjacent to the GND (ground) pads 3 which are formed on one face of the printed board 100, and are electrically connected thereto. A signal through-hole 5 is disposed in a signal land 7 inside the printed board 100. Similarly the GND (ground) through-hole 6 is physically and electrically connected to a GND (ground) layer 8.

Figure 12:
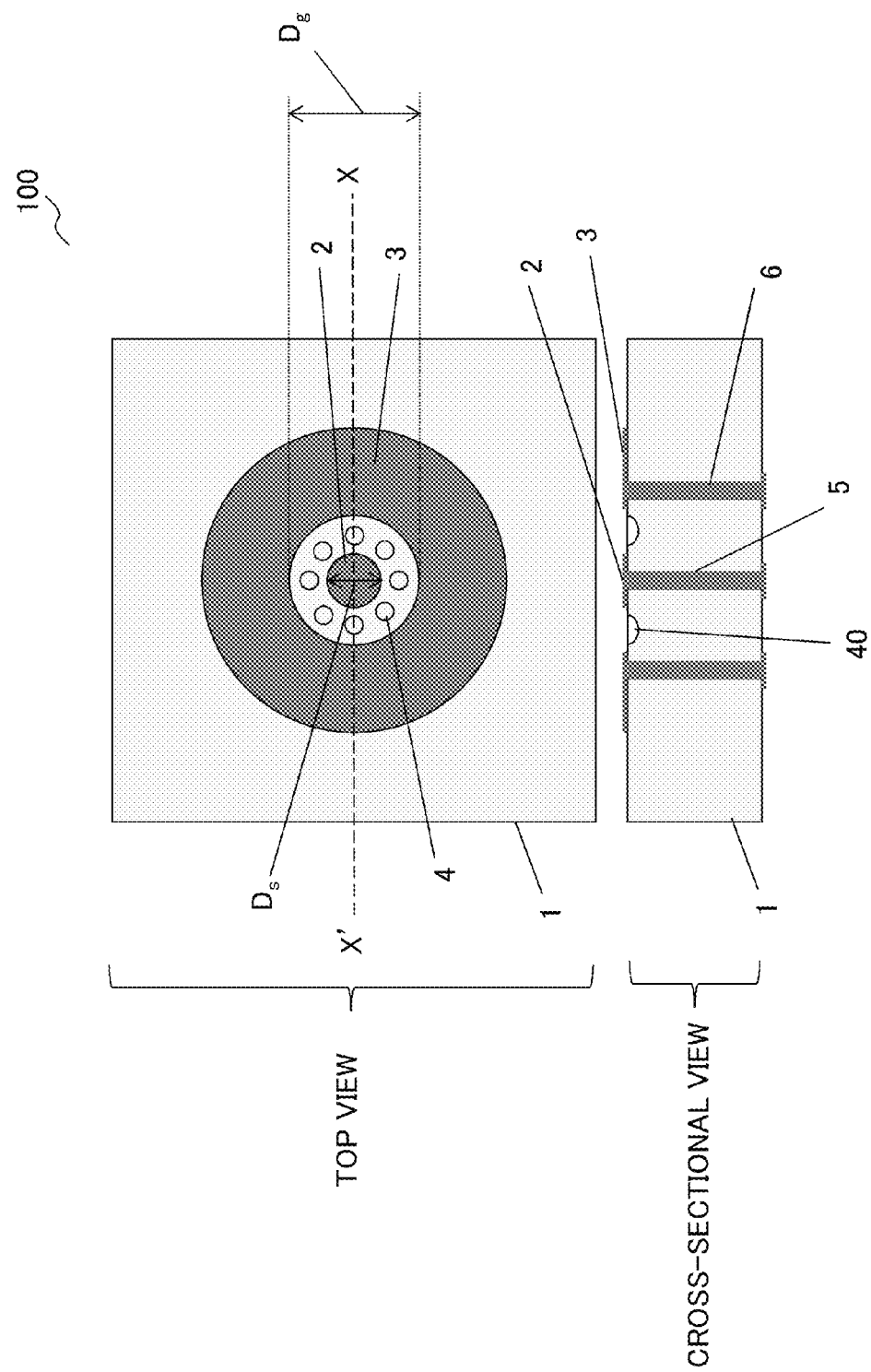
FIG. 12 is a top view and a cross-sectional view of a printed board having bowl-shaped recesses in another exemplary embodiment of the invention.

The first exemplary embodiment describes, as an example, that a plurality of circular recessed sections 4 in the substrate 1 between the signal pad 2 and the GND (ground) pad 3 in a nearly concentric manner with respect to the signal pad 2 and at nearly regular intervals. If at least one recessed section 4 is disposed, capacitive coupling is effectively suppressed. If the recessed sections 4 are disposed in a nearly concentric manner with respect to the signal pad 2, distribution of an electromagnetic field at the contact part between the coaxial connector and the printed boards 100 (FIG. 1), 200 (FIG. 2) is not changed and characteristics deterioration of transmitted signals is suppressed effectively. Although a nearly concentric configuration is not made, a configuration which suppresses change of the distribution of the electromagnetic field is available. The recessed sections 4 may be disposed nearly in a point symmetry or a line symmetry with respect to the signal pad 2. The recessed sections 4 may be disposed to surround the signal pad 2 in a doughnut shaped region. The number of places where the recessed sections 4 are disposed and the size of the places can be optionally changed in accordance with generated floating capacitance. A shape of the cross section in the depth direction of the recessed section 4 can be formed to be bowl-shaped or cylinder-shaped. FIG. 12 illustrates a top view and a cross-sectional view of a printed board 100 having bowl-shaped recesses 40. The other reference labels in FIG. 12 other than 40 are the same as those in FIG. 1. The recessed section 4 can be a drilled hole.

The invention is explained by using the above exemplary embodiments as model examples. The invention is not limited to the above exemplary embodiments. It is to be understood that to the configurations and details of the invention of the present application, various changes can be made within the scope of the invention of the present application.

This application claims priority from Japanese Patent Application No. 2013-197419 filed on Sep. 24, 2013, and the contents of which are incorporated herein by reference in their entirety.

REFERENCE SIGNS LIST 1 substrate
2 signal pad
3 GND (ground) pad
4 recessed section
5 signal through-hole
6 GND (ground) through-hole
7 signal land
8 GND (ground) layer
9 amount of reflection without recessed section
10 amount of reflection with recessed section
11 return loss in dB without recessed section
12 return loss in dB with recessed section
13 insertion loss in dB without recessed section
14 insertion loss in dB with recessed section
15 signal land
16 GND (ground) land
100 printed board
101 coaxial connector
103 connector
103a connector terminal
103b mold
200 printed board
300 printed board
400 printed board

The invention claimed is:

1. A printed board, comprising:
   a substrate;
   a circular signal pad that is provided on the substrate and is connected to a signal through hole provided in the substrate;
   a ground pad that surrounds the periphery of the circular signal pad with a space therebetween; and
   at least one recessed section disposed on the substrate between the circular signal pad and the ground pad, and a depth of the at least one recessed sections is shallower than a depth of the signal through hole.

2. The printed board of claim 1, wherein the at least one recessed section is disposed nearly point symmetrically about the signal pad or nearly line symmetrical with respect to a line passing through the signal pad.

3. The printed board of claim 2, wherein the at least one recessed section is disposed nearly in a concentric manner with respect to the signal pad and at nearly regular intervals.

4. The printed board of claim 2, wherein the at least one recessed section have recesses that are formed to be bowl-shaped or cylinder-shaped, in a thickness direction of the substrate.

5. The printed board of claim 2, wherein the at least one recessed section is disposed so as to suppress signal reflection at a connection portion when a coaxial connector and the printed circuit board are connected.

6. The printed board of claim 2, wherein the at least one recessed section have drilled holes.

7. The printed board of claim 1, wherein the at least one recessed section is disposed so as to suppress signal reflection at a connection portion when a coaxial connector and the printed circuit board are connected.

8. The printed board of claim 7, wherein the at least one recessed section have recesses that are formed to be bowl-shaped or cylinder-shaped, in a thickness direction of the substrate.

9. The printed board of claim 7, wherein the at least one recessed section have drilled holes.

10. The printed board of claim 1, wherein the at least one recessed section have drilled holes.

11. The printed board of claim 1, wherein the at least one recessed section is disposed nearly in a concentric manner with respect to the signal pad and at nearly regular intervals.

12. The printed board of claim 11, wherein the at least one recessed section have drilled holes.

13. The printed board of claim 11, wherein the at least one recessed section is disposed so as to suppress signal reflection at a connection portion when a coaxial connector and the printed circuit board are connected.

14. The printed board of claim 11, wherein the at least one recessed section have recesses that are formed to be bowl-shaped or cylinder-shaped, in a thickness direction of the substrate.

15. The printed board of claim 1, wherein the at least one recessed section have recesses that are formed to be bowl-shaped or cylinder-shaped, in a thickness direction of the substrate.

16. The printed board of claim 15, wherein the at least one recessed section have drilled holes.

17. A printed board, comprising:
a substrate;
one or more recessed sections that are disposed in the substrate between a plurality of doughnut-shaped lands formed on the substrate, and a depth of the one or more recessed sections is shallower than a depth of a signal through hole.

18. The printed board of claim 17, wherein the plurality of lands are at least one of signal lands and ground lands.

19. The printed board of claim 17, wherein the one or more recessed sections are recesses that are formed to be bowl-shaped or cylinder-shaped from the substrate.

20. A method for mounting on a printed board, comprising:
forming, on the printed board comprising a substrate, a circular signal pad that is provided on the substrate and connected to a signal through hole provided in the substrate, and a ground pad that surrounds a periphery of the circular signal pad with a space therebetween, at least one recessed section disposed on the substrate between the circular signal pad and the ground pad and a depth of the one or more recessed sections is shallower than a depth of the signal through hole.

* * * * *